(12) United States Patent
Iguchi et al.

(10) Patent No.: US 7,656,034 B2
(45) Date of Patent: Feb. 2, 2010

(54) SEMICONDUCTOR DEVICE AND METHOD FOR MANUFACTURING THE SAME

(75) Inventors: Tomohiro Iguchi, Kawasaki (JP); Hideo Nishiuchi, Kawasaki (JP); Kazuhito Higuchi, Yokohama (JP); Tomoyuki Kitani, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/208,718

(22) Filed: Sep. 11, 2008

(65) Prior Publication Data

US 2009/0072395 A1  Mar. 19, 2009

(30) Foreign Application Priority Data

Sep. 14, 2007  (JP) ............................. 2007-239558

(51) Int. Cl.
*H01L 21/60* (2006.01)
(52) U.S. Cl. ................ 257/737; 257/784; 257/E21.506
(58) Field of Classification Search .................. 257/737, 257/738, 741, 778, 784, E23.06, E21.506
See application file for complete search history.

(56) References Cited

U.S. PATENT DOCUMENTS

| 5,900,738 | A  | * | 5/1999 | Khandros et al. ........... 324/761 |
| 7,200,930 | B2 | * | 4/2007 | Khandros et al. ............. 29/860 |
| 7,368,328 | B2 | * | 5/2008 | Abbott et al. ............... 438/123 |
| 2002/0113322 | A1 | | 8/2002 | Terashima et al. | |

FOREIGN PATENT DOCUMENTS

| JP | 3240292 | 10/2001 |
| JP | 2002-76195 | 3/2002 |

* cited by examiner

*Primary Examiner*—Roy K Potter
(74) *Attorney, Agent, or Firm*—Oblon, Spivak, McClelland, Maier & Neustadt, L.L.P.

(57) ABSTRACT

A semiconductor device includes a semiconductor element, a lead, and a gold wire electrically connecting an electrode of the semiconductor element and the lead. In the semiconductor device, the gold wire is covered with a metal and is a continuous film formed by plating.

3 Claims, 4 Drawing Sheets

SEMICONDUCTOR DEVICE AND METHOD FOR MANUFACTURING THE SAME

CROSS REFERENCE TO RELATED APPLICATIONS

This application is based upon and claims the benefit of priority from prior Japanese Patent Application 2007-239558 filed on Sep. 14, 2007 the entire contents of which are incorporated by reference herein.

BACKGROUND OF THE INVENTION

1. Field of the Invention

The present invention relates to a semiconductor device and a method for manufacturing the semiconductor device. In particular, it relates to a semiconductor device capable of decreasing a resistance between an electrode of a semiconductor element and an electrode of a lead and a method for manufacturing the semiconductor device.

2. Description of the Related Art

In the recent semiconductor market, demanded are semiconductor devices which can operate at high speed and have high throughput while consuming low power during operation. In order to satisfy such opposed needs, miniaturization of a circuit of a semiconductor device has been advancing. In addition, in order to effectively utilize supplied power, the inner resistance (for example, on-resistance) of the entire semiconductor device has been decreased.

One citable example of semiconductor devices is a transistor package including a FET used for switching and amplifying a current. In this transistor package, electrodes on a semiconductor element and electrodes of leads are electrically connected by multiple wires formed of a conductive metal, such as gold (Au) or aluminum (Al).

Examples of inner resistances may include a resistance component of the wring member connecting the semiconductor element and the lead, and a resistance component of a connection between the wiring member and each electrode. In general, a metal wire is used as the wiring member. However, the resistance of this metal wire occupies a nonnegligibly-large portion in the inner resistance value of the entire semiconductor device. Accordingly, if the resistance of the metal wire could be decreased even when the metal wire is used, the resistance component of the connection between the electrode of the semiconductor element and the electrode of the lead can be also decreased.

A possible measure to achieve this is to thicken the metal wire or to increase the number of the metal wires. However, a technically-difficult problem is caused due to short-circuit of adjacent metal wires or limitations on the number of and space for the wires to be attached. In particular, when the wire is thickened, the wire becomes difficult to bend. Thereby, a loop height thereof becomes higher. Furthermore, there is not so much flexibility in designing in relation to a distance between the electrode on the semiconductor element and the electrode of the lead. For this reason, to secure a space for the bending of the metal wire, the total height of the semiconductor device has to be consequently increased.

On the other hand, as a method for lowering the resistance value of the metal wire per se, it is possible to change a metal material forming the metal wire to a material with a lower resistance than that of gold (Au) or aluminum (Al). However, this method can hardly be employed, because usable metals are limited from the viewpoint of cost and reliability in jointing portions is not so high.

As one method for solving such problems, Japanese Patent No. 3240292 and Japanese Patent Application Publication No. 2002-76195 disclose a semiconductor device in which an electrode of a semiconductor device and an electrode of a lead are electrically connected by using a plate-like conductive metal material in order to lower a resistance of the entire semiconductor device. That is, this method allows an expansion of the cross-sectional area of a current channel between the electrode of the semiconductor element and the electrode of the lead. Thereby, the resistance between the electrode and the lead can be lowered.

However, in the invention disclosed in Japanese Patent No. 3240292, a gate electrode of the semiconductor element and the lead are connected by the metal wire. Thus, for the above-described reason, there is a limitation of decreasing the inner resistance of the semiconductor device.

In addition, the invention disclosed in Japanese Patent No. 3240292 and Japanese Patent Application Publication No. 2002-76195 mainly focus on use of the plate-like conductive metal wire to decrease the resistance of the semiconductor device, and, for this reason, do not describe at all how to decrease the resistance of a semiconductor device which uses a metal wiring material other than such plate-like metal material. Furthermore, in Japanese Patent No. 3240292 and Japanese Patent Application Publication No. 2002-76195, there is no description of a method for further decreasing the resistance when the plate-like metal material is used.

The present invention has been made in view of the foregoing problems. Accordingly, an object of the present invention is to provide a semiconductor device that is highly reliable and easy to manufacture as well as that can further decrease an inner resistance without an increase in the size of the semiconductor device, and a method for manufacturing the semiconductor device.

BRIEF SUMMARY OF THE INVENTION

One aspect according an embodiment of the present invention provides a semiconductor device that includes: a semiconductor element; a lead; and a gold wire electrically connecting an electrode of the semiconductor element and the lead. The gold wire is covered with a metal and is a continuous film formed by plating.

A second aspect according an embodiment of the present invention provides a semiconductor device that includes: a substrate; a terminal provided on the substrate; an external electrode electrically connected to the terminal through a through-hole wiring; a bump electrode formed on the terminal; a semiconductor element electrically connected to the terminal through the bump electrode; and a metal film covering the terminal, the external electrode, the bump electrode, and the electrode provided on the semiconductor element and connected to the bump electrode.

A third aspect according to an embodiment of the present invention provides a method for manufacturing a semiconductor device that includes the steps of: electrically connecting an electrode provided on a semiconductor element and an electrode provided on an lead by a wiring member; covering the wiring member with a conductive material; and sealing the semiconductor element, the lead, and the wiring member covered with the conductive material.

A fourth aspect according to an embodiment of the present invention provides a method for manufacturing a semiconductor device that includes the steps of: providing an external electrode in a position blocking a through-hole wiring provided in a substrate; providing a terminal in a position where the terminal can be electrically connected to the external electrode through the through-hole electrode; forming an electrode on a semiconductor element; electrically connecting the electrode and the terminal through a bump electrode; covering the external electrode, the terminal, the bump electrode, and the electrode with a conductive material; and sealing the terminal formed on the substrate, the bump electrode, the electrode, and the semiconductor element.

BRIEF DESCRIPTION OF THE SEVERAL THE DRAWINGS

DETAILED DESCRIPTION OF THE INVENTION

Figure 1:
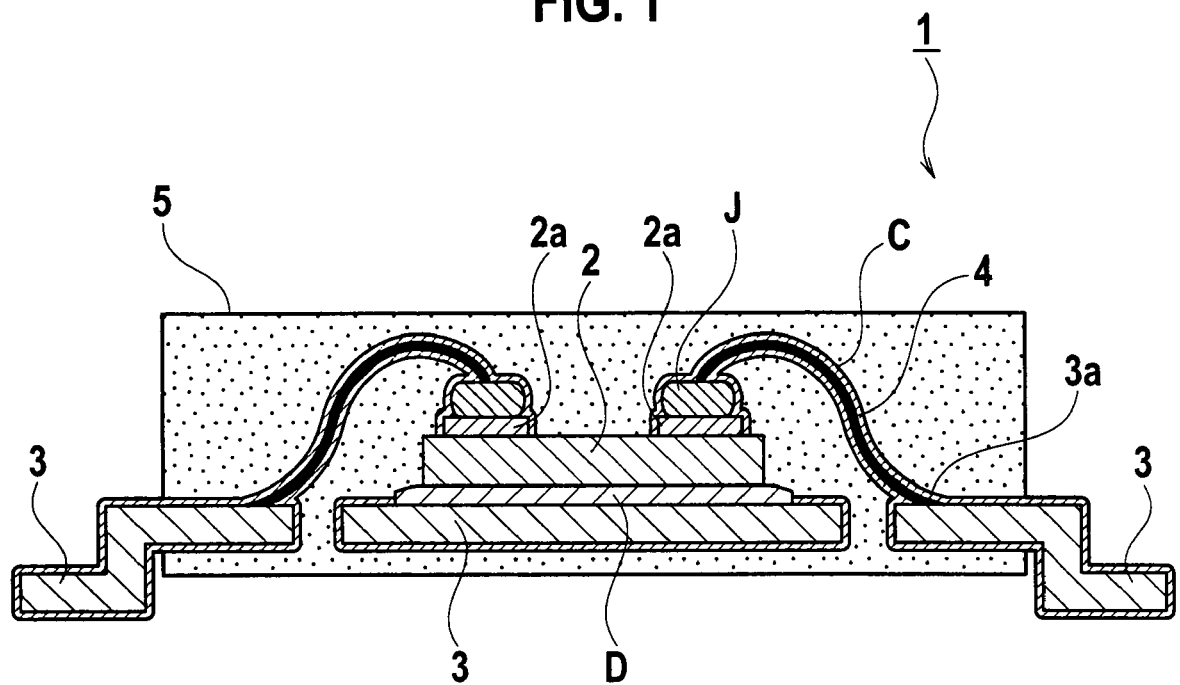
FIG. 1 is a cross-sectional view showing an entire semiconductor device according to a first embodiment of the present invention.

Preferred embodiments of the present invention will be described below in detail by referring to the drawings.

FIRST EMBODIMENT

Firstly, the configuration of a semiconductor device according to a first embodiment of the present invention will be described. As shown in a cross-sectional view of a semiconductor device 1 in FIG. 1, the semiconductor device according to the present embodiment of the present invention includes: a semiconductor element 2; leads 3, each having an electrode 3a to be connected to an electrode 2a provided on the semiconductor element 2; and wiring members 4, each covered with a conductive material C electrically connecting the electrode 2a of the semiconductor element 2 and the electrode 3a of the lead 3. In addition, a substantially entire outside part of the semiconductor device 1 including the semiconductor element 2, the leads 3, and the wiring members 4 is air-tightly sealed by a sealing resin (hereinafter referred to as an envelope 5).

The semiconductor element 2 is connected to the lead 3 through a dibond material D. In addition, the electrodes 2a (for example, a source electrode and a gate electrode) connected to the electrodes 3a provided to the leads 3 are formed on the opposite surface to the surface, which is in contact with the lead 3, of the semiconductor element 2. Note that gold (Au), copper (Cu), aluminum (Al), or the like can be preferably used as a material for the electrodes 2a. In addition, as the dibond material D, a conductive jointing material, such as, for example, a silver paste or solder is used. The application method thereof may be any method, such as a method using a dispenser or a screen printing transfer.

A conductive jointing material J, such as, for example, solder is formed on the electrode 2a. The jointing member J and one end of the wiring member 4 are connected. In the semiconductor device 1 according to the present embodiment of the present invention, the electrode 2a and the wiring member 4 are connected by ball bonding. In contrast, the other end of the wiring member 4 is connected to the electrode 3a of the lead 3. The other end of the wiring member 4 and the electrode 3a are connected by thermocompression bonding using supersonic waves together.

The lead 3 plays a role as a wiring substrate. In addition to the lead 3, for example, a ceramic wiring substrate or a resin substrate may be employed as a substrate.

In the semiconductor device 1 according to the present embodiment of the invention, a gold wire is used as the wiring member 4 in consideration of the resistance between the electrodes 2a and 3a or the like. Furthermore, the surface of the wiring member 4 (gold wire) is covered with a continuous film of the conductive material C. The wiring member 4 can be thickened by covering the wiring member 4 with the continuous film of the conductive material C. Moreover, the wiring member 4 can be thickened without using a gold wire with a large diameter, thereby avoiding an increase of cost. Here, a plating process of copper (Cu) is performed on the gold wire to cover the gold wire with the conductive material C.

Next, by referring to FIGS. 2 to 4, a method for manufacturing the semiconductor device 1 according to the first embodiment of the present invention will be described.

Figure 2:
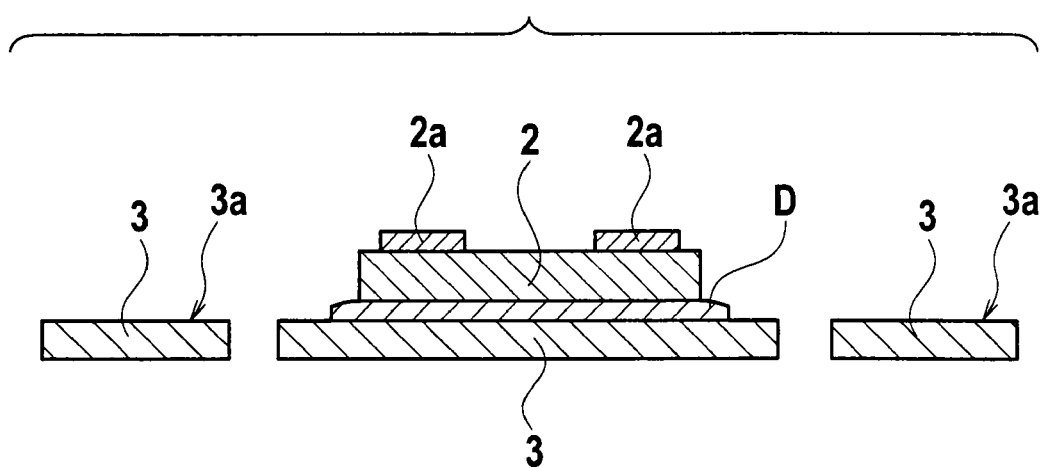
FIG. 2 is a cross-sectional view of a work for illustrating a method for manufacturing a semiconductor device according to the first embodiment of the present invention.

As shown in FIG. 2, the semiconductor element 2 is firstly connected onto the lead 3 through the dibond material D. In FIG. 2, the electrodes 2a have been already formed on the semiconductor element 2. Also, the electrodes 3a have been formed on the leads 3.

Figure 3:
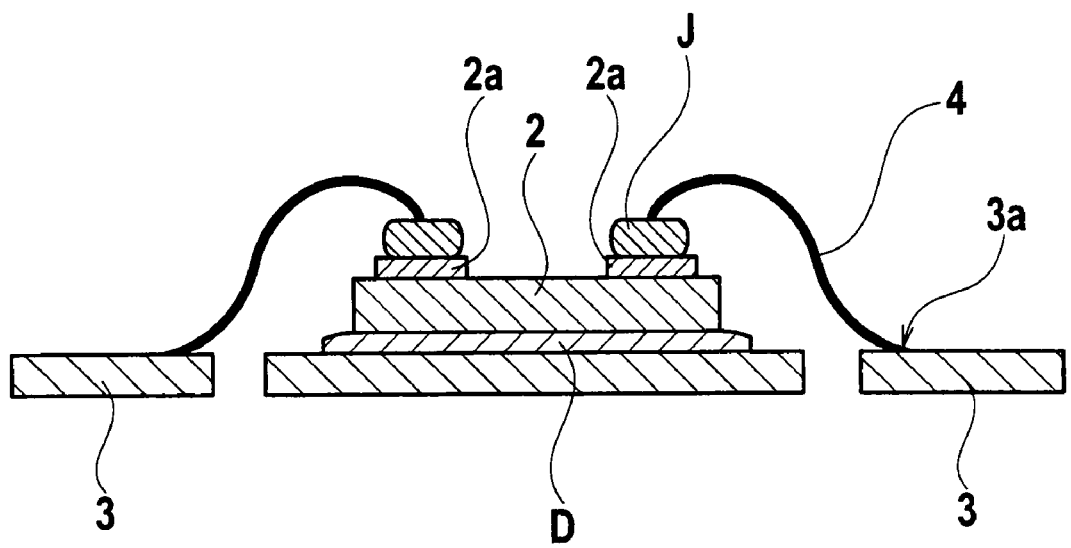
FIG. 3 is a cross-sectional view of a work for illustrating the method for manufacturing a semiconductor device according to the first embodiment of the present invention.
Figure 4:
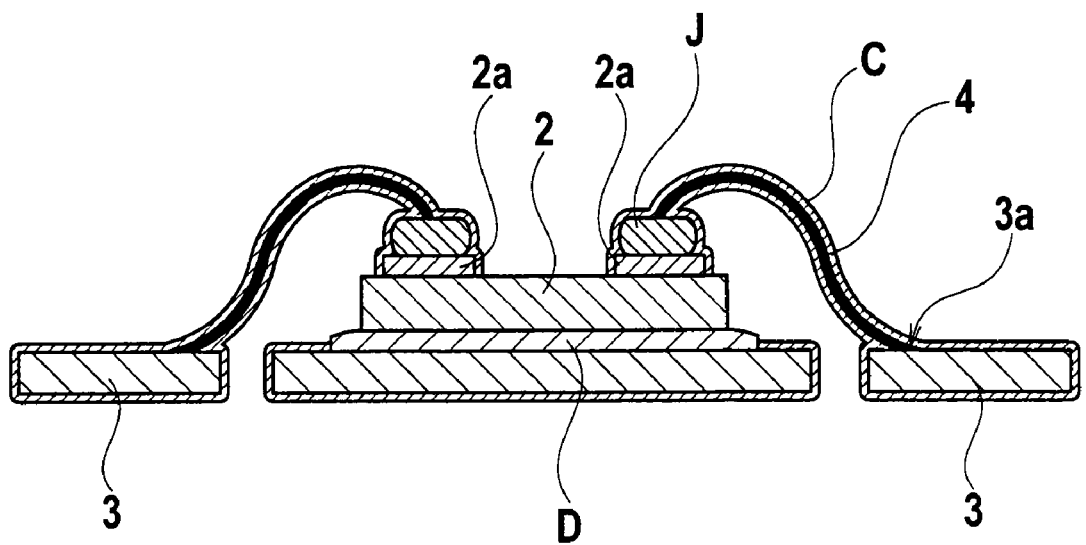
FIG. 4 is a cross-sectional view of a work for illustrating the method for manufacturing a semiconductor device according to the first embodiment of the present invention.

Subsequently, as shown in FIG. 3, the jointing member J is provided on the electrode 2a on the semiconductor element 2. Thereby, the electrode 2a is electrically connected to the electrode 3a of the lead 3 by wire bonding using the wiring member 4 (gold wire). A gold wire of, for example, 25 micron may be used as the above-described gold wire.

After that, the continuous film of a conductive material C is formed to cover the semiconductor element 2 connected on the lead 3, and the wiring member 4. As the covering conductive material C, any conductive material, such as copper (Cu) can be employed. In addition, a covering method may be any method of a plating process, vapor deposition method, sputtering method, and the like. For example, as one example, the covering method may be a method in which the semiconductor element 2 and the like are impregnated in a plating solution of copper (Cu) (this state is unillustrated). After that, one of the electrodes is connected to the lead 3 and an electric field is applied between the lead 3 and the other electrode. After the plating process, unillustrated cleaning and drying processes are carried out. Thereby, a plating film (continuous film of the conductive material C) covers the wiring member 4 and the like as shown in FIG. 4. Any thickness of the plating film covering the wiring member 4 and the like can be used.

Note that, the dibond material D connecting the semiconductor element 2 and the lead 3 and the semiconductor element 2 are not plated even if masking is not particularly carried out. The reasons are that adhesiveness of plating on the semiconductor element 2 and the like is low, and that even if an electric filed is applied, a current is difficult to flow because an electrical resistance of the semiconductor element 2 is high. In addition, it is only needed that at least the wiring member 4 is plated. Thus, masking may be used in portions that are unintended to be covered with plating.

When the plating process is performed, the wiring member 4 can be covered with the conductive material C. Thereby, the wiring member 4 can be thickened and the other end of the wiring member 4 and the electrode 3a of the lead 3 can be securely connected. That is, the other end of the wiring member 4 is connected to the electrode 3a by the above-described thermocompression bonding using supersonic waves together. Strictly speaking, a gap is caused between the wiring member 4 and the electrode 3a because the cylindrical wiring member 4 is connected to the plane electrode 3a. Such gap causes a contact resistance between the wiring member 4 and the electrode 3a to increase. However, the gap is filled by the plating and thus the wiring member 4 and the electrode 3a can be completely and continuously connected. Thereby, the contact resistance between the wiring member 4 and the electrode 3a becomes smaller.

Thereafter, the semiconductor element 2, the lead 3, and the wiring member 4 are covered with the envelope 5. As long as the envelope 5 does not disturb the characteristics of the semiconductor element, any kind of envelopes can be used. In addition, as long as the envelope 5 covers at least the semiconductor element 2 and the wiring member 4 so as to protect them, any shape of the envelope 5 can be used. Furthermore, the envelope 5 is cut after the shape of the lead 3 is formed. With the above-described manufacturing processes, the semiconductor device 1 as shown in FIG. 1 can be obtained.

As described above, in the semiconductor device in which the electrodes of the semiconductor element and the lead are connected by the metal wires, the metal wires are covered with the conductive material. Thereby, the semiconductor device can achieve high reliability and can be easily manufactured. In addition, the semiconductor device in which an inner resistance can be further decreased without increasing the size of the semiconductor device and the method for manufacturing the semiconductor device can be provided.

SECOND EMBODIMENT

Next, a second embodiment of the present invention will be described. Note that, in the second embodiment, the same reference numerals are given to denote the same components as those described in the first embodiment and the description thereof will not be repeated.

The semiconductor device 1 in the first embodiment has the electrode 2a of the semiconductor element 2 and the electrode 3a of the lead 3 being connected by the metal wire. In contrast, a semiconductor device 10 according to the second embodiment, a so-called flip chip bonding method in which electrodes 2a and 3a are connected by ball bumping is employed.

Figure 5:
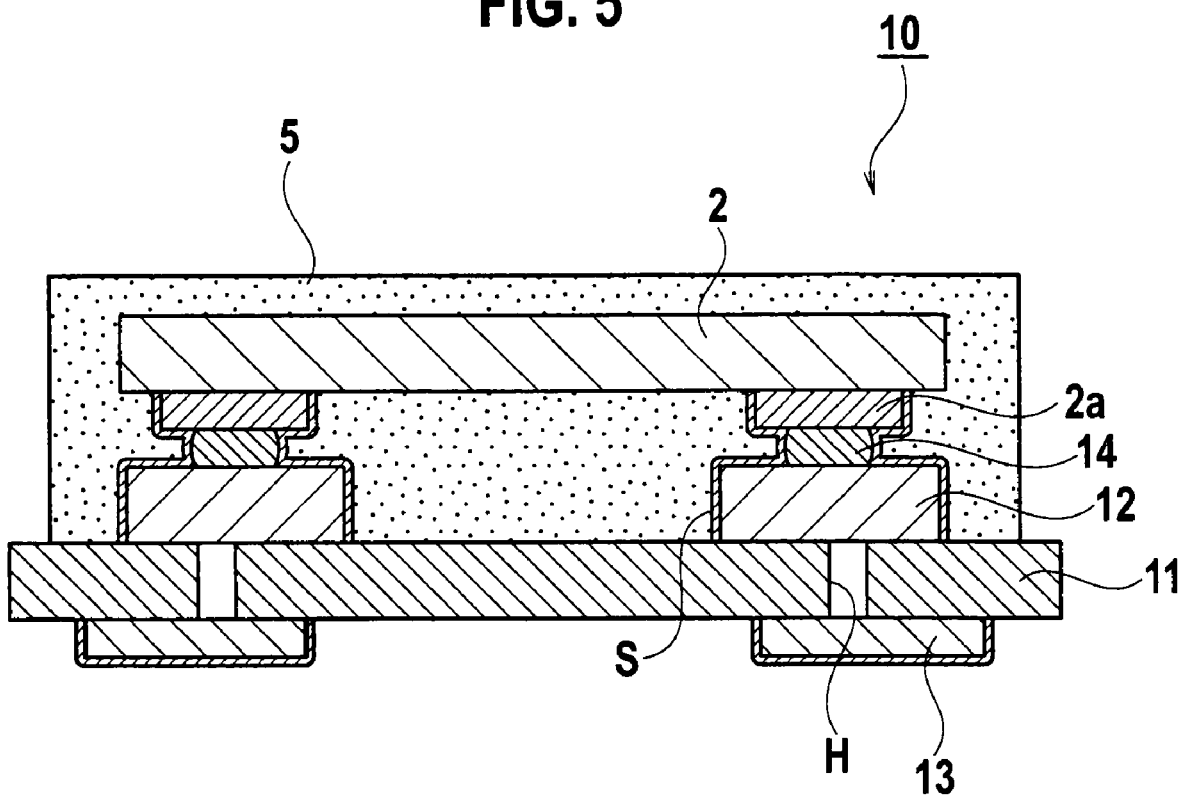
FIG. 5 is a cross-sectional view showing an entire semiconductor device according to a second embodiment of the present invention.

As shown in the cross-sectional view of the semiconductor device 10 in FIG. 5, the semiconductor device 10 includes: a substrate 11; terminals 12, each provided on the substrate 11; external electrodes 13, each electrically connected to the terminal 12 through a through-hole wiring H provided in the substrate 11; bump electrodes 14, each formed on the terminal 12; and a semiconductor element 2 electrically connected to the terminals 12 through the bump electrodes 14. In addition, a metal film S covers the terminals 12, the external electrodes 13, the bump electrodes 14, and the electrodes 2a provided on the semiconductor element 2 and connected to the bump electrodes 14. The terminals 12 formed on the substrate 11, the bump electrodes 14, the electrodes 2a and the semiconductor element 2 are sealed by an envelope 5.

The substrate 11 may be any of, for example, a ceramic wiring substrate, a resin substrate, and a lead. The terminals 12 and the external electrodes 13 are respectively connected onto the opposite surfaces of the substrate 11. Each pair of the terminal 12 and the external electrode 13 are electrically connected through the through-hole wiring H provided in the substrate 11 passing therethrough. Furthermore, the bump electrode 14 is formed on the terminal 12 and this bump electrode 14 and the electrode 2a of semiconductor element 2 are connected. Thereby, the bump electrode 14 formed on the terminal 12 and the electrode 2a are electrically connected.

Figure 6:
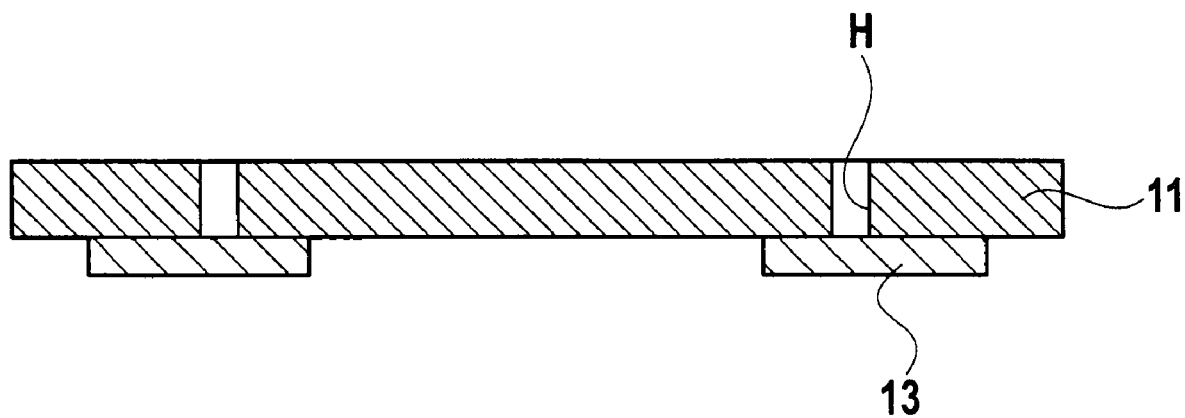
FIG. 6 is a cross-sectional view of a work for illustrating a method for manufacturing a semiconductor device according to the second embodiment of the present invention.
Figure 7:
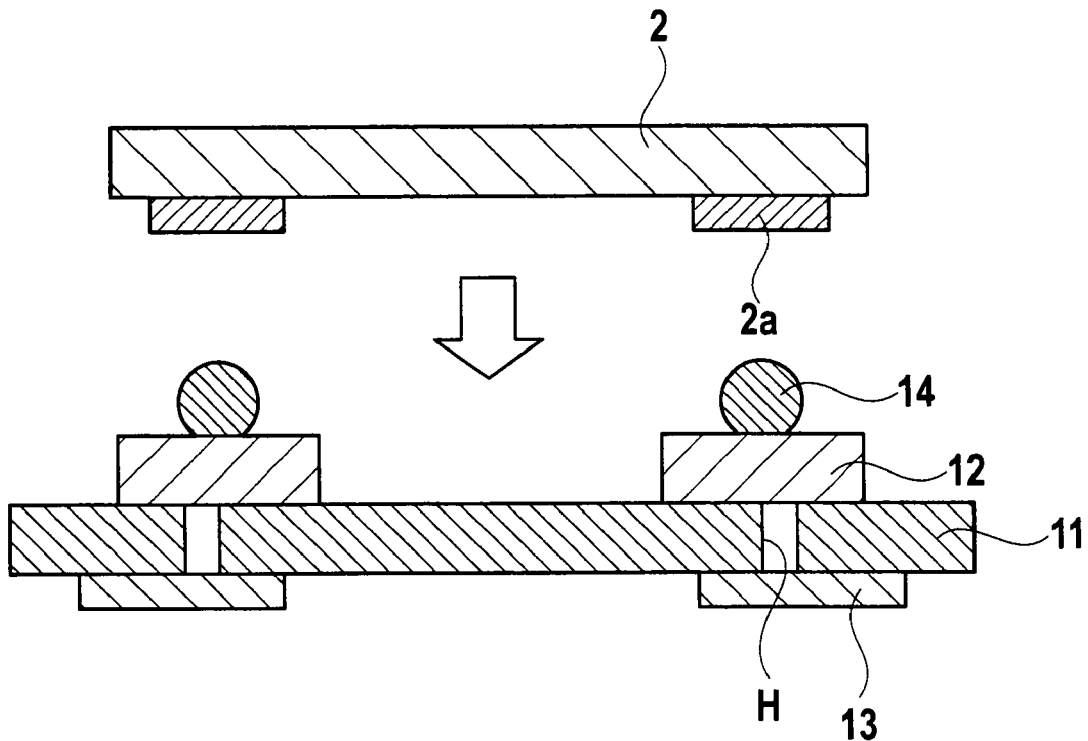
FIG. 7 is a cross-sectional view of a work for illustrating the method for manufacturing a semiconductor device according to the second embodiment of the present invention.
Figure 8:
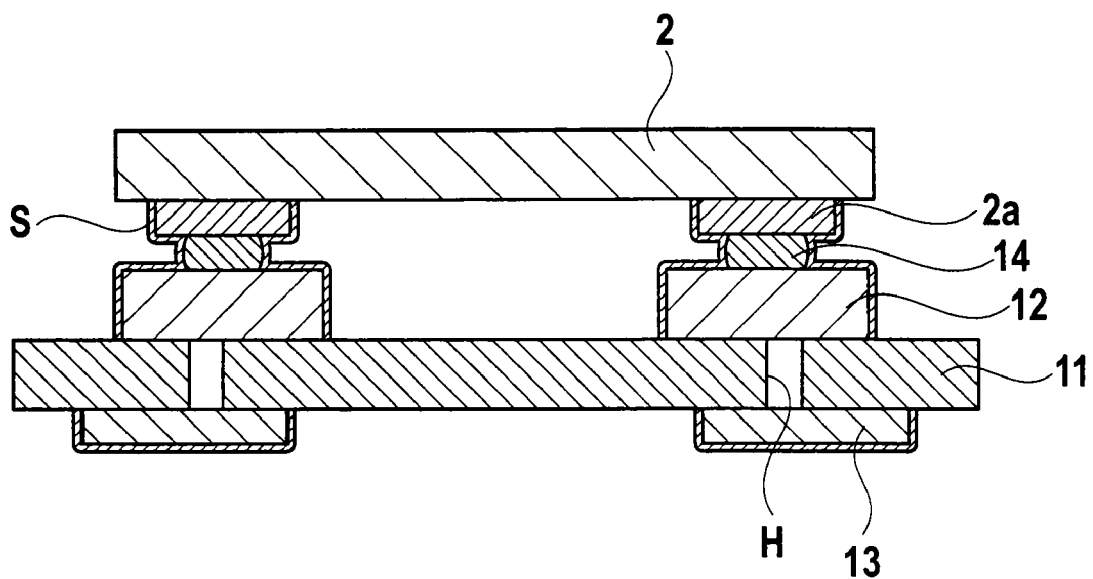
FIG. 8 is a cross-sectional view of a work for illustrating the method for manufacturing a semiconductor device according to the second embodiment of the present invention.

Next, by referring to FIGS. 6 to 8, a method for manufacturing the semiconductor device 10 according to the second embodiment of the present invention will be described.

Firstly, the substrate 11 is prepared. The through-hole wirings H are provided in predetermined positions so as to pass through the substrate 11. Then, the external electrode 13 is connected onto one side of the substrate 11 so as to block the through-hole wiring H. When the external electrode 13 is connected to the substrate 11, a preferable connection member, for example a solder paste, can be used for the substrate 11 or the like.

Next, the terminals 12 are connected to the surface of the substrate 11, opposite to the surface onto which the external electrode 13 is connected. The connection potion of the terminal 12 on the substrate 11 is a position in which the terminal 12 is electrically connected to the external electrode 13 through the through-hole wiring H. Furthermore, the bump electrode 14 is formed on the terminal 12. In addition, it is needed that the electrode 2a is formed on the semiconductor element 2 in another process. If the surface on which the electrode 2a is formed is the upper surface of the semiconductor element 2, the upper surface of the semiconductor element 2 is caused to face to the substrate 11 (terminal 12) and the semiconductor element 2 is moved in a direction shown by the arrow in FIG. 7. Thereby, the electrode 2a and the terminal 12 are flip-chip bonded by holding the bump electrode 14 therebetween.

After that, the continuous film of the conductive material C is formed to cover the substrate 11 and the semiconductor element 2 with the substrate 11 and the semiconductor element 2 being connected. For example, the substrate 11 and the semiconductor element 2 are impregnated in the plating solution of copper (Cu) (this state is unillustrated). As the plating method, for example, an electroplating method or the like may be employed. Note that any thickness of plating may be used. After the plating process, unillustrated cleaning and drying processes are carried out. Thereby, a portion other than the substrate 11 and the semiconductor element 2, as shown in FIG. 8, is plated. Thereby, the external electrodes 13, the terminals 12, the bump electrodes 14, and the electrodes 2a, which serve as a current path, are covered with the metal film S. In addition, it is only needed that these portions are plated. Thus, masking may be used in portions that are unintended to be covered with plating.

Thereafter, the terminals 12 formed on the substrate 11, the bump electrodes 14, the electrodes 2a, and the semiconductor element 2 are covered with the envelope 5. As described above, as long as the envelope 5 does not disturb the characteristics of the semiconductor element, any kind of envelopes can be used and any shape of the envelope 5 can be used. With the above-described manufacturing processes, the semiconductor device 10 as shown in FIG. 5 can be obtained.

As described above, the semiconductor device according to the present embodiment can achieve high reliability and can be easily manufactured. In addition, the semiconductor device in which an inner resistance can be further decreased without increasing the size of the semiconductor device and the method for manufacturing the semiconductor device can be provided.

In particular, in the semiconductor device according to the second embodiment, the external electrodes, the terminals, the bump electrodes, and the electrodes are covered with the metal film S. Thereby, a current path can be expanded more than that of the semiconductor device manufactured by using the conventional flip-chip bonding. Thus, the semiconductor device in which an inner resistance can be further decreased and the method for manufacturing the semiconductor device can be provided.

Note that, the present invention is not limited to the above-described embodiments and can be implemented by modifying the components in a practical phase without departing from the scope of claims. In addition, various kinds of inventions can be implemented by properly combining the multiple components disclosed in the above-described embodiments. For example, several components may be deleted from all the components shown in the embodiments. Furthermore, components covering the different embodiments may be also properly combined.

What is claimed is:

1. A semiconductor device comprising:
   a semiconductor element;
   a lead; and
   a gold wire electrically connecting an electrode of the semiconductor element and the lead, wherein
   the gold wire is covered with a metal and is a continuous film formed by plating.

2. A semiconductor device comprising:
   a substrate;
   a terminal provided on the substrate;
   an external electrode electrically connected to the terminal through a through-hole wiring provided in the substrate;
   a bump electrode formed on the terminal;
   a semiconductor element electrically connected to the terminal through the bump electrode; and
   a metal film covering the terminal, the external electrode, the bump electrode, and an electrode that is provided on the semiconductor element and is connected to the bump electrode.

3. The semiconductor device according to claim 2, wherein the metal film is formed by plating.

\* \* \* \* \*